United States Patent
Ito et al.

(10) Patent No.: US 7,564,884 B1
(45) Date of Patent: Jul. 21, 2009

(54) RIDGE-STRIPE SEMICONDUCTOR LASER

(75) Inventors: Keiji Ito, Osaka (JP); Isao Kidoguchi, Hyogo (JP); Hiroyoshi Yajima, Kanagawa (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 11/524,277

(22) Filed: Sep. 21, 2006

(30) Foreign Application Priority Data

Sep. 27, 2005 (JP) .............................. 2005-279653

(51) Int. Cl.
*H01S 5/00* (2006.01)
(52) U.S. Cl. .............................. 372/46.01; 372/46.013; 372/45.01; 372/44.01
(58) Field of Classification Search .............. 372/43.01, 372/44.01, 45.01, 46.01, 46.013, 49.01
See application file for complete search history.

(56) References Cited

U.S. PATENT DOCUMENTS

| 6,954,477 | B2* | 10/2005 | Uchida et al. ............ 372/43.01 |
| 2001/0055453 | A1* | 12/2001 | Mizuuchi et al. ............ 385/122 |
| 2002/0020847 | A1* | 2/2002 | Horie et al. .................... 257/98 |
| 2004/0233957 | A1* | 11/2004 | Ito et al. ......................... 372/46 |
| 2005/0105845 | A1* | 5/2005 | Oeda et al. ..................... 385/24 |

OTHER PUBLICATIONS

Iga, Kenichi, "Semiconductor Laser", 1st Edition, Ohm, issued on Oct. 25, 2005, p. 238, with verified partial English Translation.

* cited by examiner

*Primary Examiner*—Minsun Harvey
*Assistant Examiner*—Kinam Park
(74) *Attorney, Agent, or Firm*—McDermott Will & Emery LLP (57) ABSTRACT

A laminated composite includes: a 1st-conductive-type cladding layer laid on a substrate; an active layer laid on the 1st-conductive-type cladding layer; and a ridge-stripe 2nd-conductive-type cladding layer laid on the active layer. A pair of films is disposed at the end faces of the laminated composite so as to oppose each other along the lamination direction. The paired films are formed to have different spectral reflectances from each other. The resonator structure is formed with the laminated composite and the paired films. When, in the length direction of the resonator, a side with one of the paired films which has a smaller spectral reflectance is the forward side and a side with the other film having a larger spectral reflectance is the backward side, the laminated composite is structured so that the optical confinement factor becomes smaller on the forward side than on the backward side.

13 Claims, 8 Drawing Sheets

Prior Art

RIDGE-STRIPE SEMICONDUCTOR LASER

BACKGROUND OF THE INVENTION

1. Field of the Invention

The present invention relates to a semiconductor laser used, for example, as a light source of an optical disc apparatus, in particular to a ridge-stripe semiconductor laser.

2. Related Art

Among semiconductor lasers, semiconductor lasers made of a III-V nitride semiconductor material (e.g. $Al_xGa_yIn_{1-x-y}$ (provided that $0 \leq x \leq 1$, $0 \leq y \leq 1$)) are especially being developed to a practical level as a key device for a realization of super high density recording of optical disc apparatuses.

Figure 9:
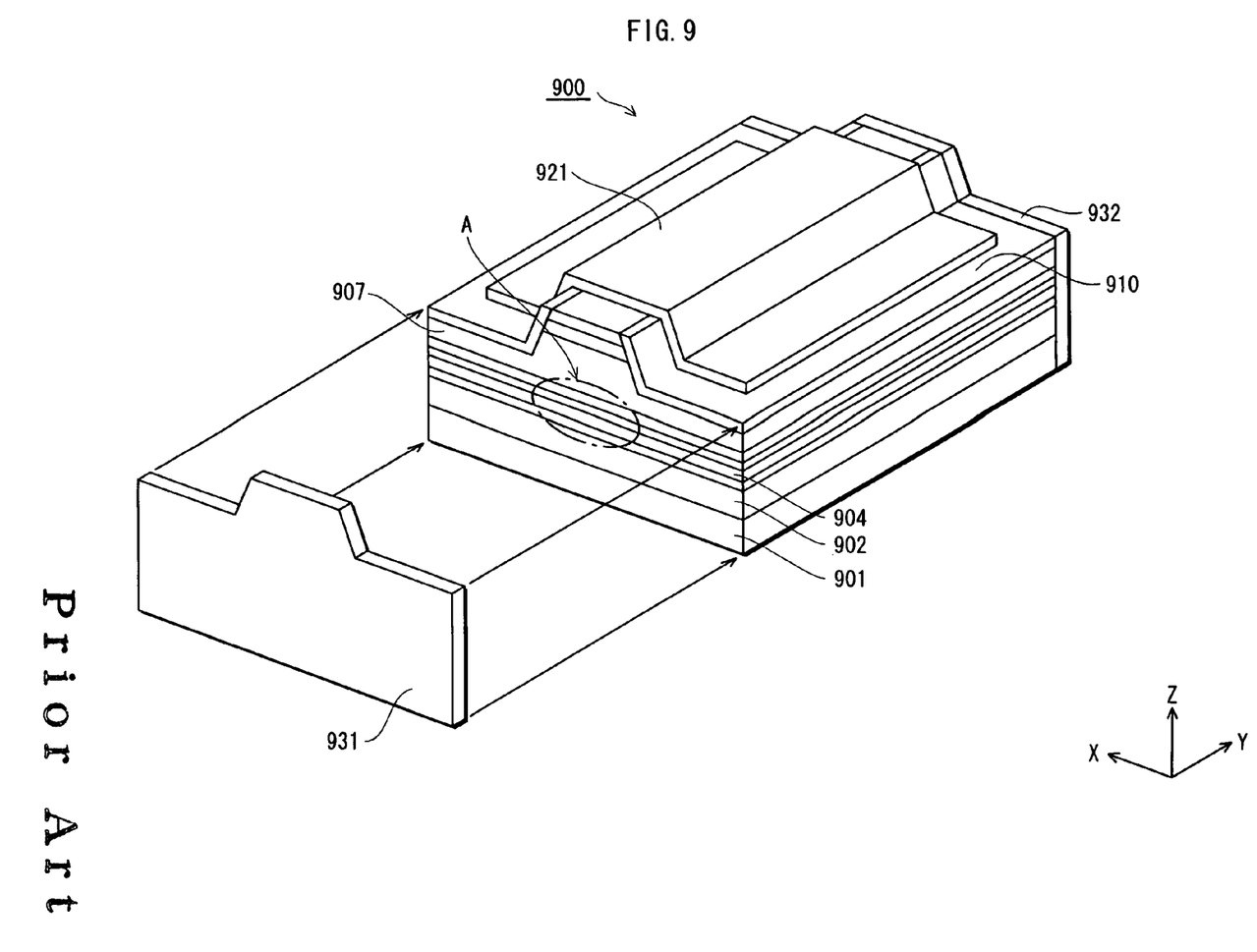
FIG. 9 is a developed perspective view of a conventional semiconductor laser.

Some semiconductor lasers have a configuration in which an n-type cladding layer 902, an active layer 904, and a p-type cladding layer 907 are formed in layers on a substrate 901, and a ridge is provided with the laminated composite, as shown in FIG. 9. A semiconductor laser 900 formed in this manner emits laser light outward according to the injected current (i.e. carriers) from a p-type electrode 921 covering the ridge and an n-type electrode (not shown) disposed on the underside of the substrate 901. At this point, since a region into which current is injected is limited only to the apex portion of the ridge by the insulating layer 910, a gain distribution occurs inside the semiconductor laser 900 and thereby a waveguide mode is formed. Thus, by increasing the carrier density in the active layer 904 and confining light, efficient laser light emission is realized.

In addition, of a pair of films 931 and 932 disposed at both ends of the laminated composite in a manner that they oppose each other along a direction substantially perpendicular to the stretching direction of the ridge (Z direction), one 931 (hereinafter, "front film") is set to have a spectral reflectance of 10% and the other 932 ("rear film") is set to have a spectral reflectance of 90% so as to form a resonator structure that emits laser light from the front film 931 in a concentrated manner. Herewith, the output of the light emitted from the semiconductor laser 900 in the forward direction is enhanced.

SUMMARY OF THE INVENTION

Figure 10A:
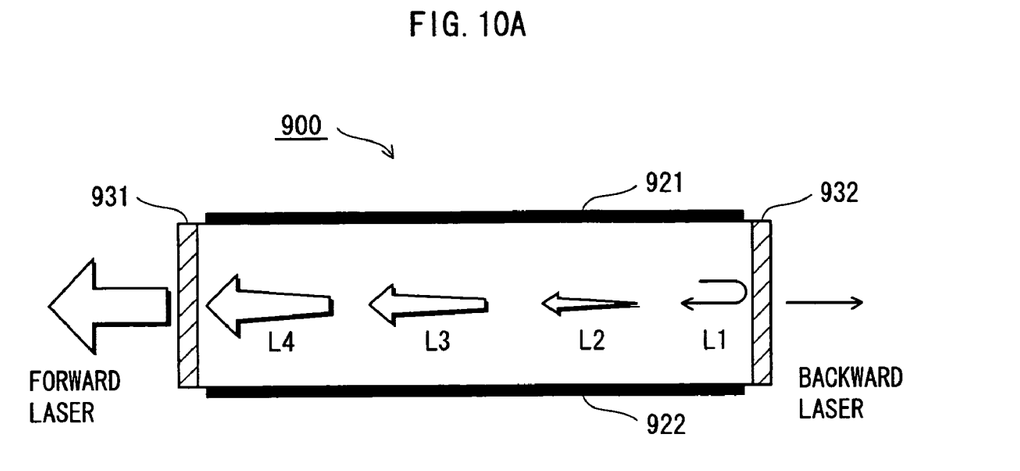
FIG. 10A is a schematic cross section of the conventional semiconductor laser.

In the case where laser light is emitted from the front film side in a concentrated manner as described above, light (photons) tends to increase on the front film 931 side, as shown in a schematic cross section along the length direction of the resonator of FIG. 10A. The inventors of the present application consider the following is the cause of this phenomenon.

Figure 10B:
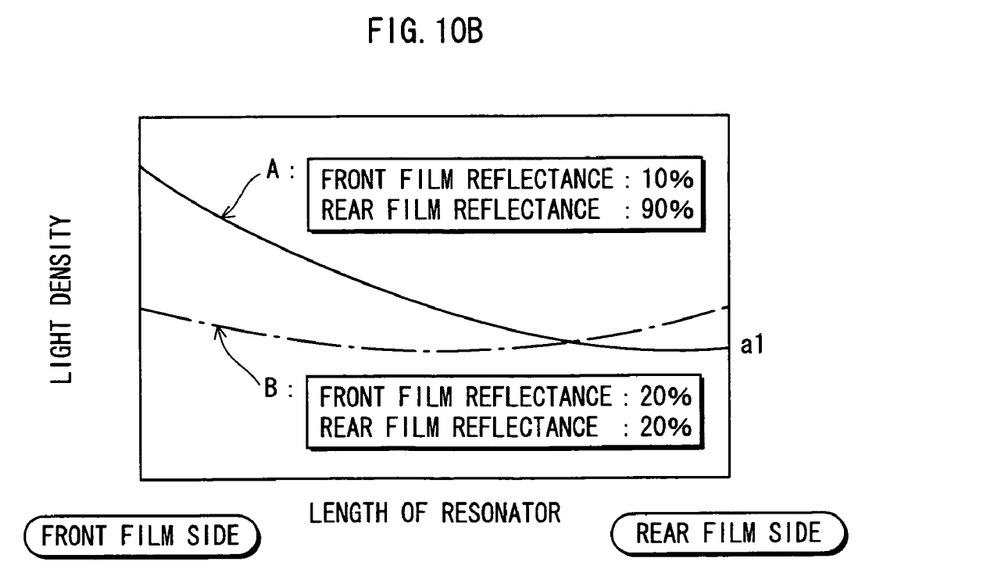
FIG. 10B is a light density distribution thereof.

When light generated inside the semiconductor laser 900 due to stimulated emission reaches the front film 931 side, the most of the light is emitted outward and the remaining little light is reflected backward. On the other hand, when the backward reflected light reaches the rear film 932, the most of the light is reflected to the forward side. As a result, more light progresses towards the front film 931 as compared to light progressing towards the rear film 932, and therefore the number of photons on the front film 931 side increases cumulatively. FIG. 10B schematically shows this phenomenon. The figure shows a simulation of the light density distribution inside the semiconductor laser 900 based on measurements of the emitted laser light intensity. When the laser light is emitted from the front film 931 in a concentrated manner (Curve A), the light density distribution is represented by a curve largely upward on the front film 931 side.

If the light density becomes too high on the front film 931 side, the carrier density starts to less efficiently increase when current is injected into the active layer 904, and the stimulated emission becomes less likely to occur on the front film 931 side. That is, although the carrier density required for the stimulated emission increases as the light density becomes higher, the carrier density does not increase in spite of the light density increasing on the emission side. As a result, the stimulated emission occurs less effectively although current is injected continuously. Furthermore, the output of the laser light may decrease over time or become unstable.

The present invention relates to a semiconductor laser having a resonator structure in which a pair of films having different spectral reflectances from each other are disposed at the end faces of the laminated composite, and aims at offering a configuration that improves characteristics of the laser light output and stabilizes the laser light output. Accordingly, the semiconductor laser of the present invention adopts the following configuration.

A 1st-conductive-type cladding layer (hereinafter, referred to as "1st cladding layer") is laid on top of a substrate, and an active layer is disposed on the 1st-conductive-type cladding layer. Then, a ridge-shaped 2nd-conductive-type cladding layer ("2nd cladding layer") is provided on the active layer. On the end faces of a laminated composite formed by including the layers above, a pair of films is disposed to oppose each other along the lamination direction. The laminated composite and the paired films form a resonator structure. Here, the 1st and 2nd cladding layers are made of nitride semiconductor materials, and the active layer is made of a semiconductor material having a larger photorefractive index than the 1st and 2nd cladding layers. The paired films are made of dielectric materials so as to have different spectral reflectances from each other. Assume here that, of the paired films, a film having a smaller spectral reflectance is located on the forward side along the length direction of the resonator structure formed in the above-described manner, and the other film having a larger spectral reflectance is located on the backward side. The laminated composite is configured so that the optical confinement factor on the forward side becomes smaller than that on the backward side. Note that the "optical confinement factor" indicates a function of confining light generated in the semiconductor laser. When the optical confinement factor is small, the function of confining the light which contributes to the output of the laser light is restrained in the active layer area and the vicinity thereof.

Herewith, although the light density increases on the forward side due to the intensive emission of the laser light on the forward side, the present invention is able to restrain the increase of the light density on the forward side as compared to the above conventional technique. Accordingly, the stimulated emission is not blocked, and it is possible to maintain a state in which the light progressing toward the front film and the injected current favorably contribute to the emission of laser light. Accordingly, the output characteristics of the semiconductor laser of the present invention are improved. Furthermore, it is made possible to emit high-power light from one end of the semiconductor laser and realize stable emission of the laser light.

A specific example of the above-mentioned configuration of the present invention is that an insulating layer is laid on the 2nd cladding layer, and has a higher refractive index on the forward side thereof than on the backward side in the length direction of the resonator. Herewith, the refractive index of the insulating layer becomes comparatively larger than that of the 2nd cladding layer, which restrains the light confinement function of the interface between the 2nd cladding layer and the insulating layer. Accordingly, the optical confinement factor on the forward side is set smaller than that on the backward side. Alternatively, the present invention may take a configuration in which the 2nd cladding layer is thicker, in the length direction of the resonator, on the forward side than on the backward side. Herewith, the 2nd cladding layer has a larger occupied region on the forward side than on the backward side, and a region where light confinement takes place becomes comparatively larger on the forward side than on the backward side. As a result, the light confinement function is reduced on the forward side as compared to the backward side, and the optical confinement factor becomes smaller on the forward side than on the backward side.

In these configurations, an optical waveguide can be efficiently formed in the semiconductor laser when the width of the ridge is no less than 1 μm and no more than 5 μm. In addition, the output of the laser light can be increased by arranging multiple ridges of the 2nd cladding layer in parallel. Note that the laser light can be emitted from the forward side in a concentrated manner by setting the spectral reflectance of the front film lower than that of the rear film by at least 15%. Especially, it is preferable to set the spectral reflectance of the front film in the range of 0.01% and 50%, and that of the rear film in the range of 30% and 100%.

The active layer should be made of a III-V nitride semiconductor material for producing high power laser light, and preferably made of an AlGaAs semiconductor material or an AlGaInP semiconductor material.

With the settings for the configuration of the laminated composite, the optical confinement factor can be made smaller on the forward side than on the backward side by, for example, structuring the insulating layer to include portions made of different materials and creating differences in refractive indexes along the length direction of the resonator, or changing the thickness of the p-type cladding layer along the length direction of the resonator. The configurations above are also capable of achieving the above-mentioned effect while maintaining the output of the laser light equivalent to that of the conventional technique.

BRIEF DESCRIPTION OF THE DRAWINGS

These and other objects, advantages and features of the invention will become apparent from the following description thereof taken in conjunction with the accompanying drawings which illustrate specific embodiments of the invention. In the drawings.

DESCRIPTION OF PREFERRED EMBODIMENTS

The semiconductor laser of the present invention is described next with the aid of drawings. Note that the configurations of the semiconductor laser below are merely examples and the present invention is therefore not confined to these.

1. First Embodiment

1.1 Overall Configuration

Figure 1A:
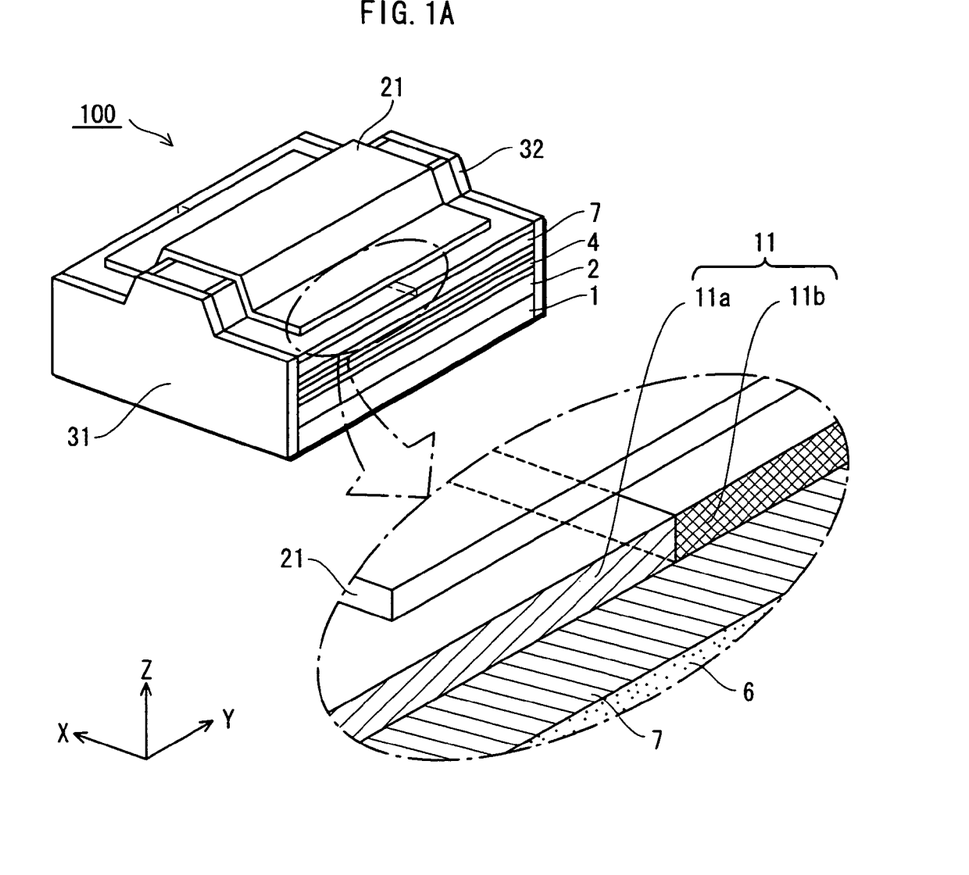
FIG. 1A is a perspective view of a semiconductor laser of Embodiment 1.

FIG. 1A is a perspective view of a semiconductor laser 100. The semiconductor laser 100 has the following configuration: a laminated composite is formed by including an n-type cladding layer 2 and a p-type cladding layer 7, between of which an active layer 4 is disposed, and a pair of dielectric multilayer films 31 and 32 are positioned at the end faces of the laminated composite.

Figure 1B:
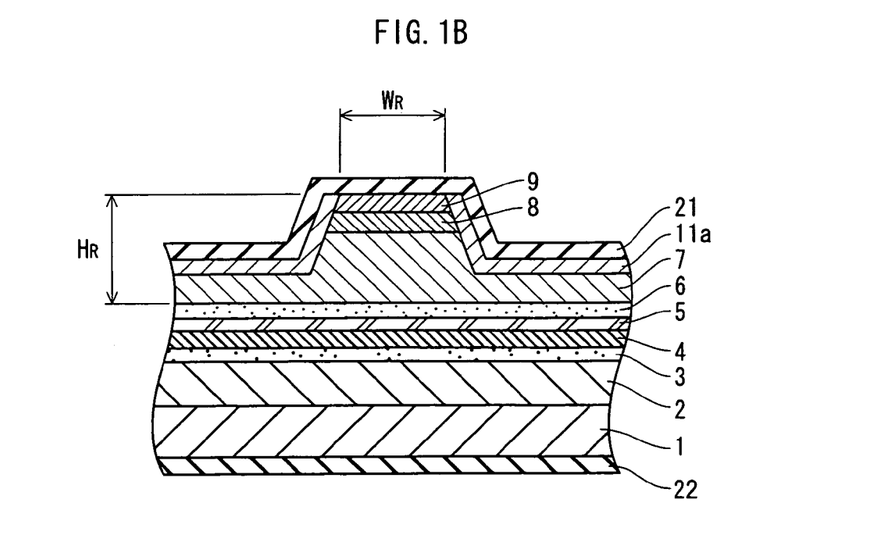
FIG. 1B is a cross section thereof.

FIG. 1B shows a schematic cross section of the semiconductor laser 100 and the above-mentioned laminated composite is composed of the following layers.

A substrate 1 is an n-type GaN substrate, having the dimensions of 300 μm in width, 600 μm in length, and 400 μm in thickness.

The n-type cladding layer 2 of n-type $Al_{0.05}Ga_{0.95}N$ with a thickness of 1.2 μm is laid on the substrate 1. Disposed on the n-type cladding layer 2 is an n-type GaN optical guide layer 3 with a thickness of 0.05 μm.

The active layer 4 of InGaN with a thickness of 23 μm is disposed on the optical guide layer 3. The active layer 4 has a multiple quantum well structure including three well layers (3 μm in thickness) and two barrier layers (7 μm in thickness). Note that the active layer ~4 is set to have a larger reflective index than the n-type cladding layer 2. Laid on the active layer 4 is an undoped GaN cap layer 5 with a thickness of 0.01 μm, on top of which a p-type GaN optical guide layer 6 of 0.05 μm thickness is disposed.

The p-type cladding layer 7 of p-type AlGaN with a thickness of 0.5 μm is laid on the optical guide layer 6, and has a so-called "ridge stripe", which is a trapezoidal ridge. The ridge has a width $W_R$ (i.e. the length of the top side of the trapezoidal section in the p-type cladding layer 7, which comes into contact with a contact layer 8 to be hereinafter described) of about 1.5 μm and a height $H_R$ of 0.5 μm. Disposed on the ridge is the p-type GaN contact layer 8 of 0.15 μm thick, on which a p metal 9 of Pd with a thickness of 0.05 μm is laid. Note that the p-type cladding layer 7 is set to have a smaller refractive index than the active layer 4.

The insulating layer 11 is, as shown in the figure, positioned on top of the p-type cladding layer 7 without covering the apex portion of the ridge. The insulating layer 11 is a characteristic feature of the present embodiment, and the details are given hereinafter.

Electrodes 21 and 22 are positioned to sandwich therebetween the laminated composite in the lamination direction. The p-type electrode 21 positioned on the upper side (on the side where the ridge is formed) is made of Ti/Pt/Au, has a thickness of 0.3 μm, and is laid to follow the shape of the ridge. On the other hand, the n-type electrode 22 positioned on the lower side (on the side where no ridge is formed) is made of Mo/Ti/Au and has a thickness of 0.3 μm. With these electrodes 21 and 22, carriers (holes) are injected inside the laminated composite from the apex portion of the ridge.

The dielectric multilayer films 31 and 32 coat both cleaved ends of the laminated composite. The paired dielectric multilayer films 31 and 32 function as the exit faces of the laser light, and form a resonator structure when disposed on the laminated composite. Of the dielectric multilayer films 31 and 32, the film 31 on one side (hereinafter, referred to as the "front film") has a spectral reflectance of 10% while the other film 32 (referred to as the "rear film") has a spectral reflectance of 90%.

In the semiconductor laser 100, the width $W_R$ of the ridge is set in the range of 1 μm to 5 μm for producing high-powered laser light. Additionally, in the case of making the front film 31 the main exit face, laser light emission from the front film 31 side in a concentrated manner can be realized by setting the spectral reflectance of the front film 31 lower than that of the rear film 32 by approximately 15%. In particular, it is preferable that the spectral reflectances of the front film 31 and the rear film 32 be set in the range of 0.01% to 50% and 30% to 100%, respectively, with the difference in the spectral reflectances maintained.

1.2 Configuration of Insulating Layer 11

As to the configuration of the insulating layer 11, specifically speaking, the insulating layer 11 is made up of two insulating layers 11a and 11b, as shown in the enlarged illustration of FIG. 1A.

These insulating layers 11a and 11b are formed to come in contact with each other in substantially the middle in the length direction of the resonator (Y direction). The insulating layer 11a formed on the front film 31 side (hereinafter, referred to as the "front insulating layer") is made of $Ta_2O_5$, and the insulating layer 11b disposed on the rear film 32 side (referred to as the "rear insulating layer") is made of $SiO_2$. The front and rear insulating layers 11a and 11b have lengths of 240 µm and 360 µm in the Y direction, respectively, while having substantially the same thickness.

The front and rear insulating layers 11a and 11b are made of different materials, as described above, and have different refractive indexes. The refractive indexes of the front and rear insulating layers 11a and 11b at an emission wavelength 400 nm are 2.23 and 1.49, respectively. By causing the front insulating layer 11a to have a larger refractive index than the rear insulating layer 11b, the light confinement due to stimulated emission is reduced on the front film 31 side as compared to the rear film 32 side. That is to say, the optical confinement factor of the semiconductor laser 100 becomes smaller on the front insulating layer 11a side than on the rear insulating layer 11b side in the length direction of the resonator. The light confinement is originally implemented to efficiently emit light outward that is generated inside the semiconductor laser 100 in accordance with the amount of current injection. Accordingly, as the light confinement performance (the optical confinement factor) is higher, light generated by stimulated emission is more efficiently used for the laser emission. However, due to the difference between the front and rear films 31 and 32 in spectral reflectance, the amount of light reflected by the rear film 32 and then traveling forward is larger than that of light reflected by the front film 31 and then traveling backward. Therefore, the light density may cumulatively increase on the front film 31 side if the front and rear films 31 and 32 have the same optical confinement factor, however, the increase of the light density on the front film 31 side can be reduced by setting a small optical confinement factor for the front film 31 side as in the case of the present embodiment.

1.3 Formation Procedure of Insulating Layer 11

The forming method of the insulating layer 11 composed of the two types of insulating layers 11a and 11b is described next with the aid of FIG. 2. FIGS. 2A to 2E include a schematic perspective view and cross sectional views showing steps of the forming procedure of the semiconductor-laser.

Figure 2A:
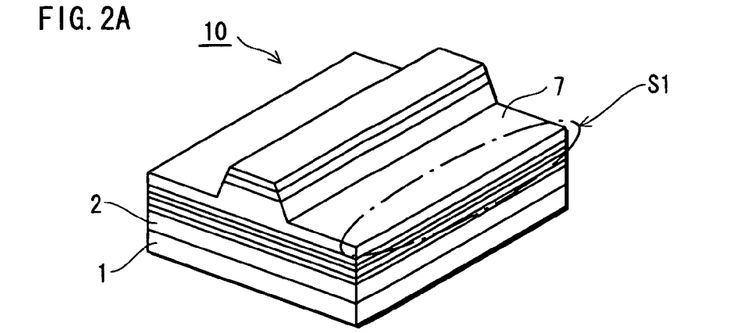
FIGS. 2A to 2E show steps of a manufacturing procedure of the semiconductor laser of Embodiment 1.

The active layer 4 is disposed between the cladding layers 2 and 7, and the contact layer 8 and p metal 9 are sequentially laid in layers on the p-type cladding layer 7. Subsequently, a laminated composite 10, in which the p-type cladding layer 7, contact layer 8 and p metal 9 are processed to shape a ridge stripe, is formed as shown in FIG. 2A, using a publicly known method such as a dry etching method.

Figure 2B:
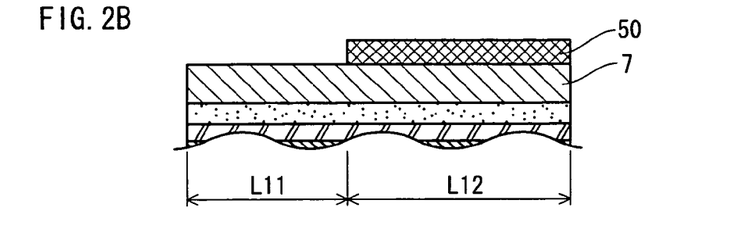

The next and subsequent processes are described next with the focus on S1 shown in FIG. 2A. First, a region stretching a distance L12 from one edge is covered by an acetone-soluble resist layer 50 as shown in FIG. 2B.

Figure 2C:
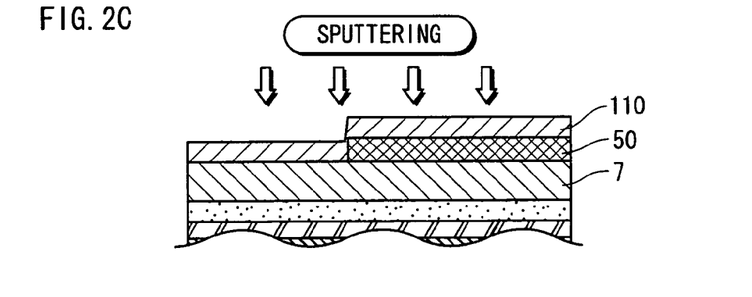
Figure 2D:
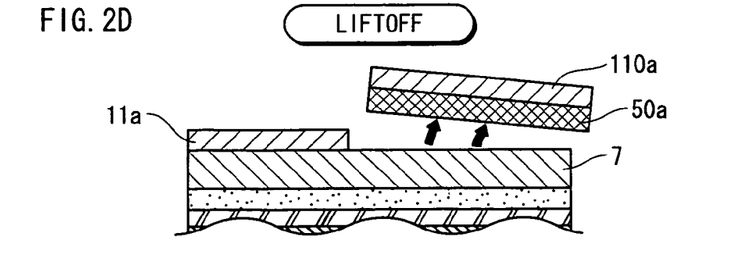
Figure 2E:
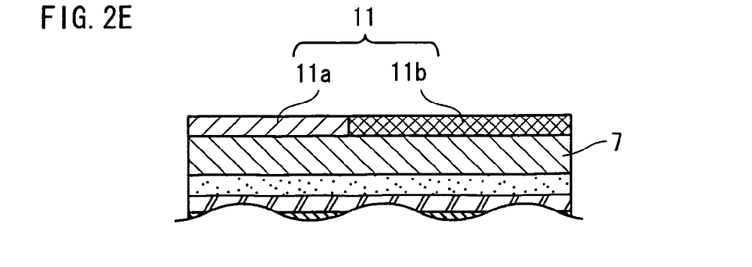

Subsequently, an insulating film layer 110 of $Ta_2O_5$ is formed on the top surface of the laminated composite 10 by ECR sputtering, magnetron sputtering or the like, as shown in FIG. 2C. Note that a masking material should be used for the apex portion of the ridge so that the apex portion is not covered by the insulating film layer 110.

Then, the portion covered by the insulating film layer 110 is impregnated with resist-dissolving acetone to thereby dissolve the resist layer 50. Furthermore, using a so-called liftoff method in which the covered portion is immersed in an ultrasound bath to remove a part 11a of the insulating film layer 110 that covers the dissolved resist layer 50, the front insulating layer 11a is formed in a region stretching a distance L11 from the other edge.

Similarly, the rear insulating layer 11b of $SiO_2$ is formed in the region stretching the distance L12 from the edge, with the same thickness as the front insulating layer 11a, and thus the front and rear insulating layers 11a and 11b cover the laminated composite, except for the apex portion of the ridge. Note that the rear insulating layer 11b may be formed first before the front insulating layer 11a.

1.4 Modification 1

Figure 3:
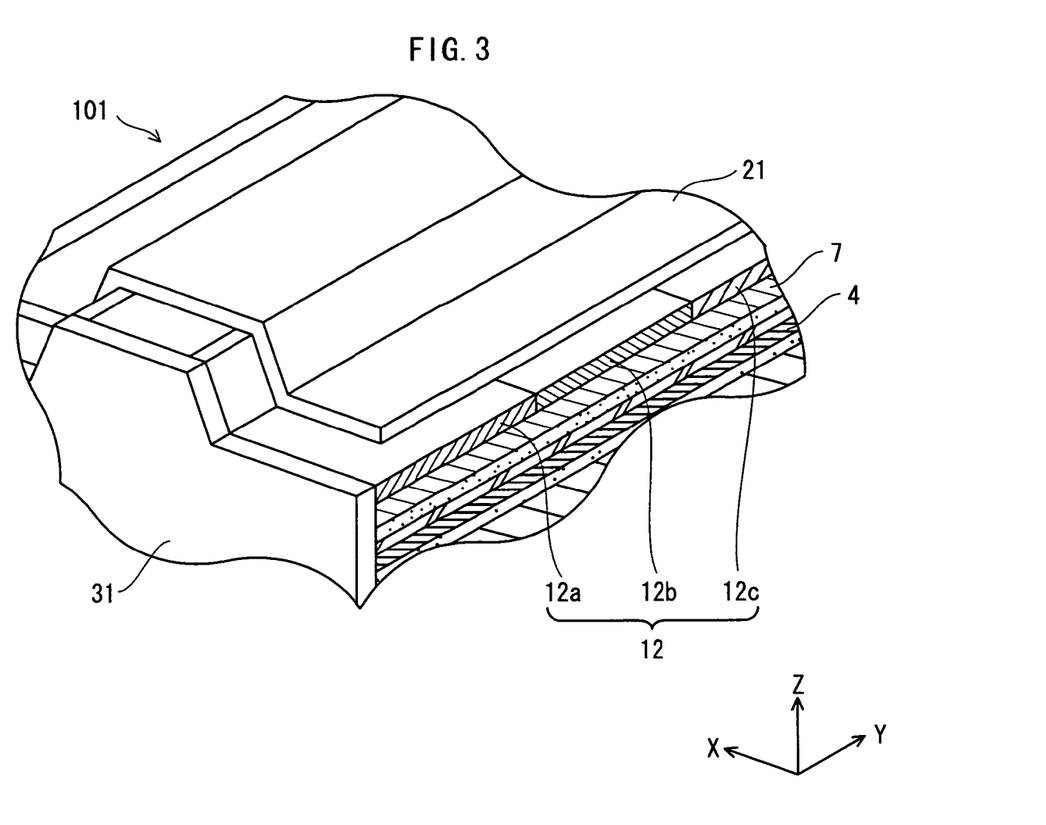
FIG. 3 is a perspective view showing relevant parts of a semiconductor laser of Modification 1.

As to an insulating layer 12, it may have a configuration composed of three insulating layers 12a, 12b and 12c, as shown in FIG. 3. It is however necessary that the insulating layers 12a, 12b and 12c block current injection and have smaller refractive indexes than the active layer 4 does so as to have light confinement effects.

The 1st insulating layer 12a is disposed on the front film 31 side and made of $Ta_2O_5$.

The 2nd insulating layer 12b is disposed next to the 1st insulating layer 12a and made of $Si_3N_4$.

The 3rd insulating layer 12c is disposed on the rear film 32 side and next to the 2nd insulating layer 12b, and made of $SiO_2$.

The insulating layers 12a, 12b and 12c have lengths of 180 µm, 120 µm and 300 µm in the length direction of the resonator, respectively, and have refractive indexes of 2.23, 2.04 and 1.49, respectively. It is desirable that the optical confinement factor be reduced on the front film 31 side where the light density tends to increase, and the optical confinement factors are set to be sequentially smaller to the front film 31 side from the rear film 32 side. Herewith, the optical confinement factor of a semiconductor laser 101 of Modification 1 is also set smaller on the front film 31 side than on the rear film 32 side.

1.5 Verification Experiment

In order to examine the effect of the insulating layers 11 and 12, an experiment was implemented using the following semiconductor lasers. Note that they differ only in the configuration of the insulating layer.

WORKING EXAMPLE 1

The Semiconductor Laser 100 Where the Insulating Layer 11 of the Present Embodiment is Disposed

WORKING EXAMPLE 2

The Semiconductor Laser 0.101 Where the Insulating Layer 12 of Modification 1 Above is Disposed

COMPARATIVE EXAMPLE

The Semiconductor Laser 900 Where an Insulating Layer, the Whole of Which is Made of the Same Material, is Disposed in the Length Direction of the Resonator With Working Examples 1 and 2 and Comparative Example, the intensities of the laser lights emitted from the front film and the rear film were separately measured, and the light density distributions inside the semiconductor lasers 100, 101 and 900 were simulated based on the measurements.

Figure 4:
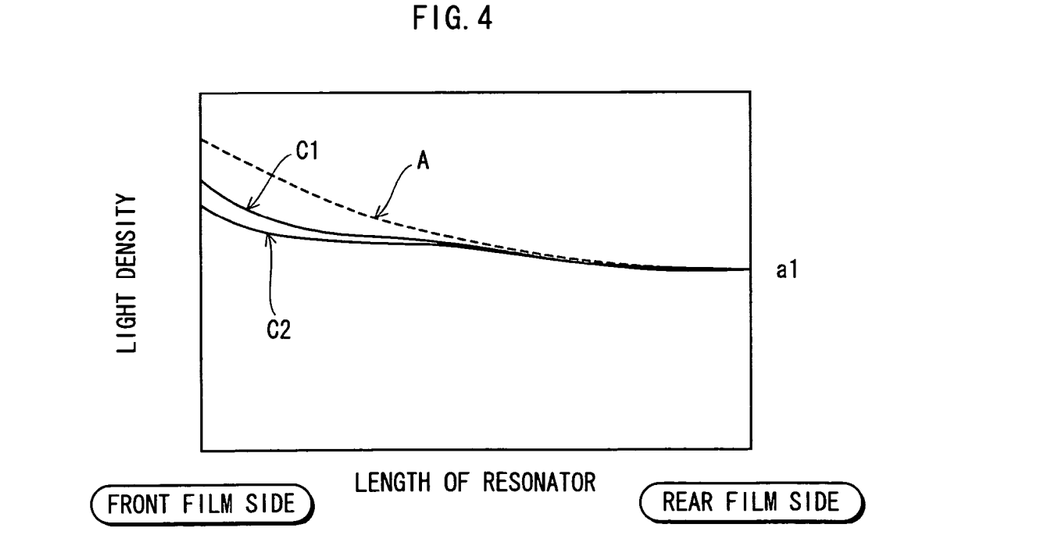
FIG. 4 shows a light density distribution of the semiconductor laser of Embodiment 1.

The results of the simulation are shown in FIG. 4. FIG. 4 shows the light density distributions of Working Examples 1 and 2 and Comparative Example with curves C1, C2 and A, respectively. Note that these curves represent relative figures obtained when the light density of the rear film of the semiconductor laser 900 of Comparative Example is used as a reference value.

As is clear from FIG. 4, Comparative Example (Curve A) exhibits a higher light density on the front film side than on the rear film side. On the other hand, the light densities of Working Examples 1 and 2 (Curves C1 and C2) level off as compared to Curve A, with the increase of the light density on the forward side being reduced. This is attributed to that the insulating layers 11 and 12 are made to have a larger refractive index on the front film 31 side than on the rear film 32 side so that the optical confinement factor becomes smaller on the front film 31 side than on the rear film 32 side. That is, even if the laser light is being emitted from the front film 31 in a concentrated manner, an increase in the light density on the front film 31 side is reduced as compared to Comparative Example since the optical confinement factor on the front film 31 side is relatively smaller than that on the rear film 32 side. As a result, in Working Examples 1 and 2, the amount of the injected current efficiently contributes to the stimulated emission, and the semiconductor laser 100 of the present embodiment is capable of emitting a high-power and stable laser light.

Figure 5:
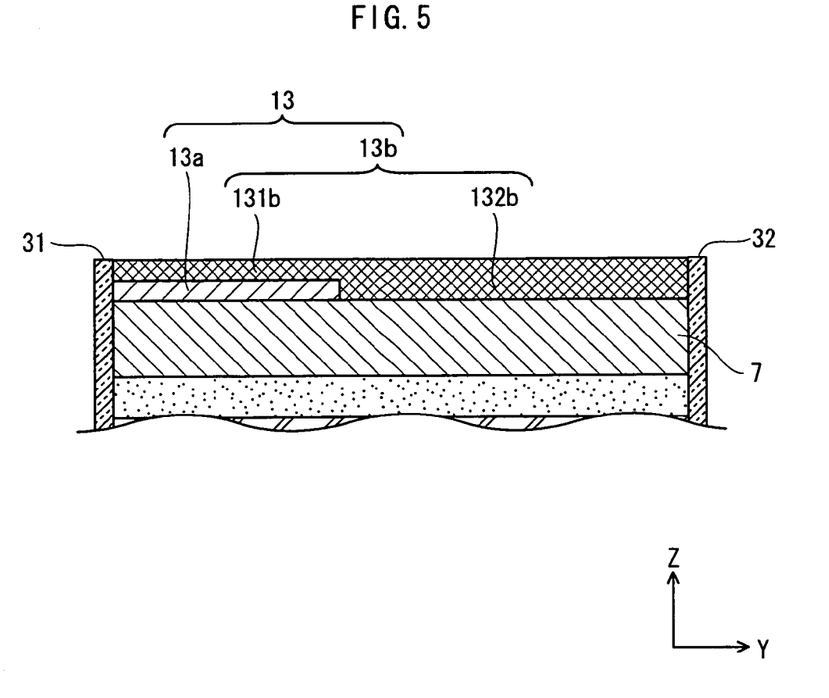
FIG. 5 is a perspective view showing relevant parts of a semiconductor laser of Modification 2.

Regarding the insulating layers 11 and 12, a configuration other than the above may be adopted, as shown in FIG. 5. In the figure, an insulating layer 13 consists of two components each made of a different type of constituent material: a thin insulating layer 13a of $Ta_2O_5$ disposed on the front film 31 side; and a thick insulating layer 13b of $SiO_2$ disposed on the rear film 32 side and covering the thin insulating layer 13a. With this configuration, the optical confinement factor can also be reduced to be lower on the front film 31 side as compared to the rear film 32 side. Additionally, even if the thin insulating layer 13a has a low dielectric strength voltage, the strength voltage can be improved by an extending portion 131b of the thick insulating layer, which is laid on top of the thin insulating layer 13a. The insulating layers 11, 12 and 13 of the present embodiment are individually composed of two or three layers each made of a different material. The insulating layer of the present invention, however, may be made of more than two or three different types of layers if the above-mentioned relationship regarding the optical confinement factor in the length direction of the resonator is assured.

2. Embodiment 2

Figure 6:
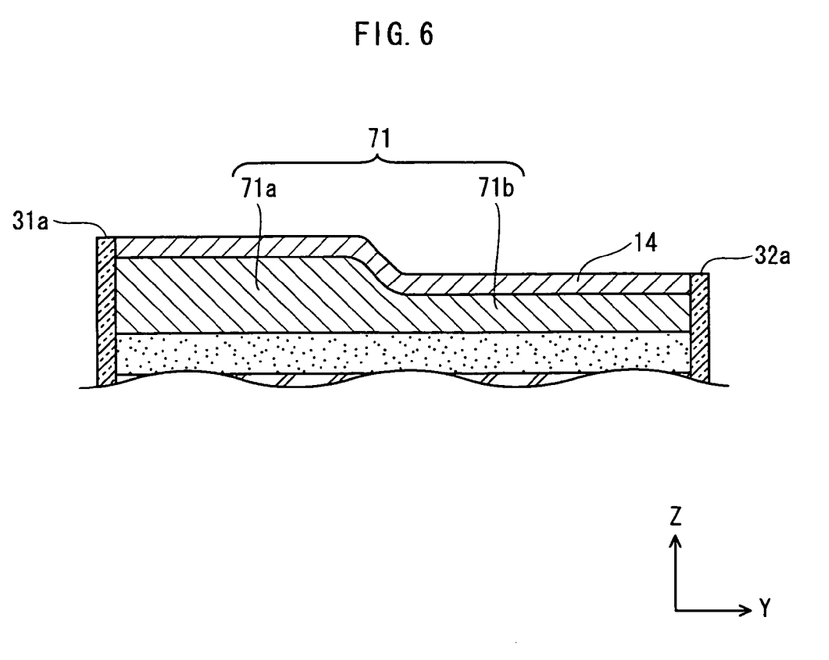
FIG. 6 is a perspective view showing relevant parts of a semiconductor laser of Embodiment 2.

A semiconductor laser 102 having a different form from Embodiment 1 is described next with the aid of FIG. 6. FIG. 6 is a schematic cross section of the semiconductor laser 102 along the length direction of the resonator. Note that the present embodiment is different from Embodiment 1 only in the configurations of the p-type cladding layer and insulating layer and the sizes of the front and rear films, and therefore the descriptions of other components are left out here.

2.1 Configuration

The thickness of a p-type cladding layer 71 changes in the length direction of the resonator (Y direction) as shown in FIG. 6, and a thick layer portion 71a is formed on a front film 31a side while a thin layer portion 71b is formed on a rear film 32a side. Specifically speaking, the p-type cladding layer 71 has a thickness of 0.25 μm at the front end and a thickness of 0.18 μm at the rear end.

Laid on the p-type cladding layer 71 is an insulating layer 14 made of $SiO_2$. Note that, unlike that of Embodiment 1, the insulating layer 14 is not formed in a manner that the refractive index changes therein, and thus has substantially the same refractive index in the length direction of the resonator.

In addition, although the configurations of the front and rear films 31a and 32a are the same as in the case of Embodiment 1, the sizes of the main faces of these films are accordingly adjusted in response to the change in thickness of the p-type cladding layer 71.

According to the configuration, the semiconductor laser 102 of the present embodiment has a reduced optical confinement factor on the front film 31a side as compared to the rear film 31b side, similarly to Embodiment 1. As a result, the light density distribution on the front film 31a side in the length direction of the resonator does not significantly increase, and the present embodiment therefore realizes continuously high power and stable laser light emission.

Although the entire insulating layer 14 of the present embodiment is made of the same material so that the refractive index is substantially constant in the length direction of the resonator, an insulating layer made of multiple materials, as in the case of Embodiment 1 above, may be used instead. It is, however, desirable that the optical confinement factor be set in a manner that the light density does not excessively increase in a local region and is substantially constant over the length of the resonator. Furthermore, although the thickness of the p-type cladding layer 71 gradually changes around the boundary between the thick and thin layer portions 71a and 71b as shown in FIG. 6, the p-type cladding layer may be separated in two at the boundary with a step created therebetween. In addition, the p-type cladding layer 71 is formed, in the present embodiment, to have two largely distinguishable thicknesses, however, the p-type cladding layer may have three or more portions with different thicknesses. Nonetheless, from the aspect of manufacturing cost and the like, the number of the portions is preferably between 2 and 10, more preferably between 2 and 6.

2.2 Forming Method

Next is described the forming method of the semiconductor laser 102 having the above-mentioned shape with the aid of FIG. 7.

Figure 7A:
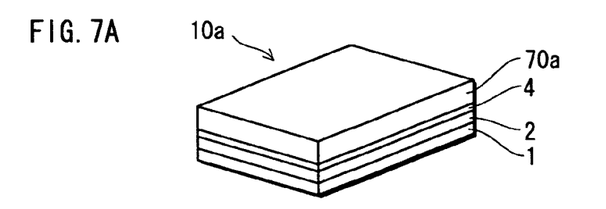
FIGS. 7A to 7H show steps of a manufacturing procedure of the semiconductor laser of Embodiment 2.

A 1st laminated composite 10a is formed in which the active layer 4 is disposed between the n-type cladding layer 2 and a p-type cladding layer 70a, as shown in FIG. 7A. The layers stacked one on top of the other have substantially the same width and length. Note that the optical guide layer and the like are not shown as a matter of convenience.

Figure 7B:
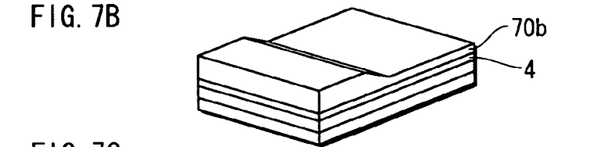

In the p-type cladding layer 70a disposed at the top in the 1st laminated composite 10a, a part of the cladding layer stretching in the longitudinal direction (Y direction) from one edge is processed to form a thin film by a publicly known method such as etching, as shown in FIG. 7B.

Figure 7C:
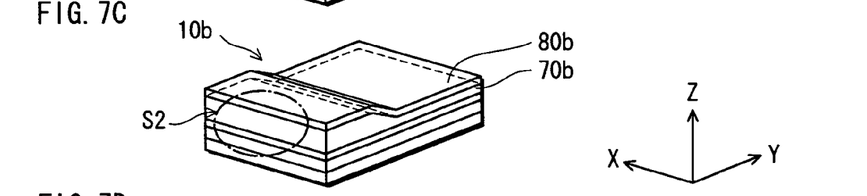

A contact layer 80b is laid to follow the shape of the p-type cladding layer 70b after the thin film process to thereby form a 2nd laminated composite 10b, as shown in FIG. 7C.

Figure 7D:
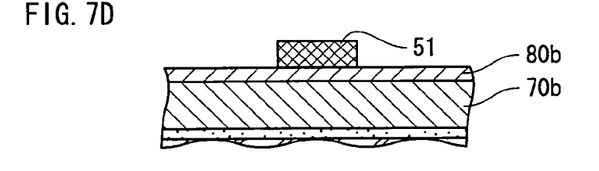

Subsequently, a resist layer 51 is disposed in the middle of the top surface of the 2nd laminated composite 10b so as to extend along the length direction (Y direction). This state is shown in FIG. 7D of a cross section with relevant parts, where a part S2 of the 2nd laminated composite 10b is focused.

Figure 7E:
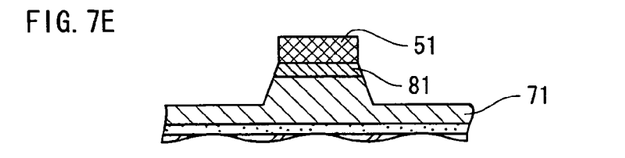
Figure 7F:
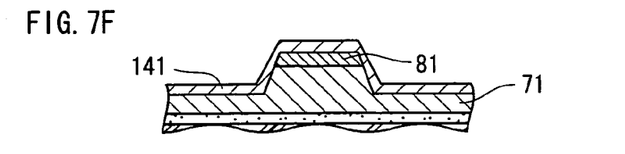

A ridge is formed by dry-etching the region not masked by the resist layer 51, as shown in FIG. 7E. The resist layer 51 is then removed, and an insulating layer 141 is laid over the entire surface along the ridge stripe by ECR sputtering, as shown in FIG. 7F.

Figure 7G:
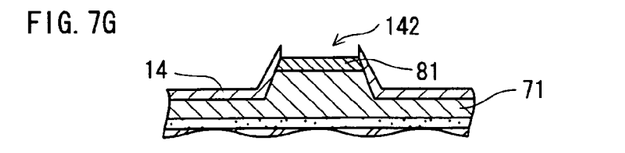
Figure 7H:
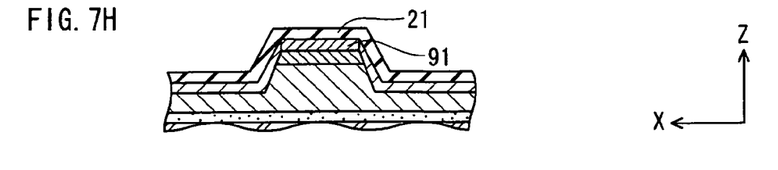

Subsequently, a part of the insulating layer 141 corresponding to the apex portion of the ridge is removed by a photolithography method, and a gap 142 is formed as shown in FIG. 7G. Furthermore, p metal is positioned in the gap 142, and the p-type electrode 21 is disposed to cover the ridge, as shown in FIG. 7H.

Thus, according to the above steps is formed the ridge-stripe semiconductor laser 102 with the p-type cladding layer including the thick and thin layer portions.

3. Additional Particulars

The semiconductor laser of the present invention can use the following as the constituent materials.

Any substrate can be used as the substrate 1 if it allows a III-V nitride semiconductor material to grow thereon epitaxially, and, for example, a sapphire substrate or a SiC substrate can be used. The sizes of the substrate are preferably: 100 μm to 2000 μm (especially 200 μm to 700 μm) in width; 100 μm to 3000 μm (especially 200 μm to 1000 μm) in length; and 30 μm to 4000 μm (especially 50 μm to 200 μm) in thickness. As the n-type cladding layer 2, an n-type AlGaN/GaN superlattice cladding layer is applicable, and the thickness is preferably in the range of 0.2 μm and 5 μm (especially 0.4 μm and 3 μm). The active layer 4 preferably has a total thickness of 0.002 μm to 0.2 μm (especially 0.005 μm to 0.05 μm). As to the p-type cladding layer 7, a cladding layer made of p-type AlGaInN or p-type AlGaInN/AlGaInN superlattice is applicable, and the thickness including the ridge is favorably in the range of 0.2 μm to 5 μm (especially 0.4 μm to 3 μm).

As the optical guide layers 3 and 6, one made of n-type or p-type GaInN is also applicable, and the thickness is preferably in the range of 0.001 μm to 3 μm (especially 0.1 μm to 1 μm). The cap layer 5 preferably has a thickness in the range of 0.001 μm to 3 μm (especially 0.1 μm to 1 μm). The contact layer 8 should have a width and length adjusted for the ridge, and preferably has a thickness of 0 μm to 2 μm (especially 0.1 μm to 0.5 μm). Note that each of the above layers except for the contact layer 8 has the same width and length as the substrate 1.

The spectral reflectances of the front and rear films 31 and 32 can be controlled by the refractive index of a dielectric material, layer thickness and the number of layers. The materials of these films 31 and 32 are not especially restricted but $SiO_2$, $Ta_2O_5$, SiON, $Al_2O_3$, $Si_3N_4$, AlON, $ZrO_2$, $TiO_2$, and $Nb_2O_5$ are applicable. Each of the films 31 and 32 preferably has a thickness in the range of 0.001 μm and 3 μm (especially 0.003 μm and 1 μm).

Additionally, the shape of the ridge is not limited to trapezoid, and could be rectangle with substantially vertical lateral sides.

Figure 8:
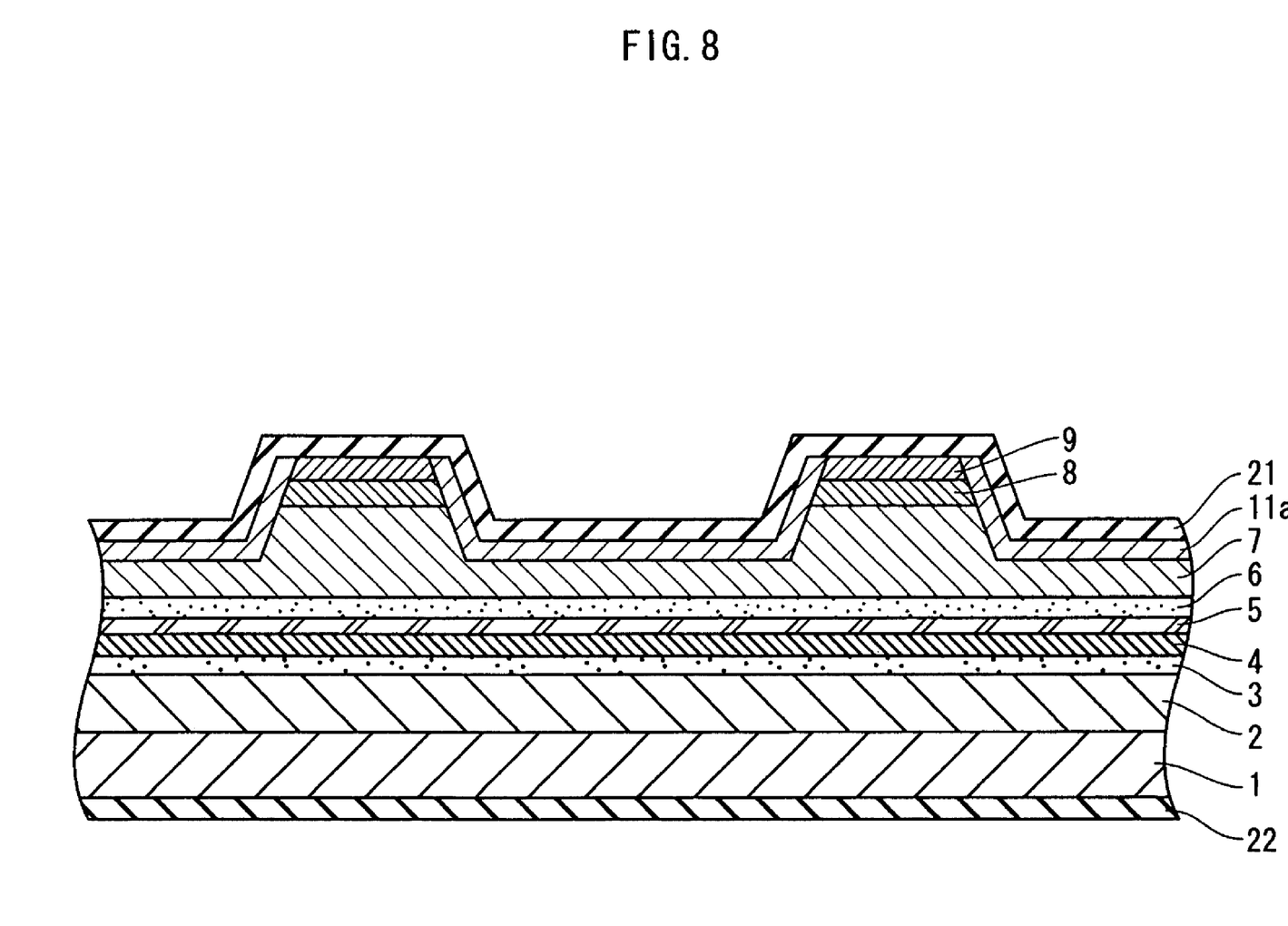
FIG. 8 is a perspective view showing relevant parts of a semiconductor laser having double ridges.

In order to produce higher light output, a method of arranging multiple laser devices in parallel may be adopted. For example, organizing two of such laser devices each having a ridge—like the laser of each embodiment above—in parallel produces twice the light output. An effect equivalent to this can also be obtained by forming two ridges in a single laser device, as shown in FIG. 8. That is, the present invention is applicable to a laser device having multiple ridges. Accordingly, the present invention may take a configuration in which multiple ridges are formed and the insulating layer 11, 12, 13 or 14 is disposed on the ridges without covering the apex portions thereof.

Furthermore, an etch stop layer may be inserted into the p-type cladding layer 7 so as to be located directly below the ridge. Here, the etch stop layer may be formed from a p-type AlGaInN monolayer or a p-type AlGaInN/AlGaInN multilayer. The composition ratio of Al in the etch stop layer (the average composition ratio of Al in the case of a multilayer) is preferably in the range of 0.05 to 0.6 (especially in the range of 0.15 to 0.4). A small composition ratio of Al results in a reduction in selectivity for dry etching. On the other hand, if it is too large, the operating voltage of the device may rise high with an increase in the band discontinuity between the etch stop layer and the p-type cladding layer 7. The width and length of the etch stop layer are favorably the same as those of the substrate while the thickness being in the range of 1 nm and 500 nm (especially 5 in the range of 5 nm and 50 nm).

Although the present invention has been fully described by way of examples with reference to the accompanying drawings, it is to be noted that various changes and modifications will be apparent to those skilled in the art. Therefore, unless otherwise such changes and modifications depart from the scope of the present invention, they should be constructed as being included therein.

What is claimed is:

1. A semiconductor laser having a resonator formed on a semiconductor substrate, the resonator including:
    a $1^{st}$ cladding layer;
    an active layer disposed on the $1^{st}$ cladding layer;
    a $2^{nd}$ cladding layer disposed on the active layer and having a stripe ridge portion;
    an insulating layer disposed on the $2^{nd}$ cladding layer so as not to cover an upper surface of the ridge portion; and
    a front film and a rear film disposed on each end face of the resonator, wherein
    the front film has a smaller reflectance than the rear film, and
    the insulating layer includes, on a side close to the front film, a $1^{st}$ insulating film having a $1^{st}$ refractive index and, on a side close to the rear film, a $2^{nd}$ insulating film having a $2^{nd}$ refractive index, the $1^{st}$ refractive index being larger than the $2^{nd}$ refractive index.

2. The semiconductor laser of claim 1, wherein the $2^{nd}$ cladding layer is thicker on the side close to the front film than on the side close to the rear film.

3. The semiconductor laser of claim 1, wherein the $2^{nd}$ cladding layer includes one or more ridge portions in addition to the ridge portion, the ridge portions being in parallel one to another.

4. The semiconductor laser of claim 1, wherein the front film has an at least 15% smaller reflectance than the rear film.

5. The semiconductor laser of claim 4, wherein the reflectance of the front film is in a range of 0.01% to 50% inclusive, and the reflectance of the rear film is in a range of 30% to 100% inclusive.

6. The semiconductor laser of claim 1, wherein the active layer is made of a III-V nitride semiconductor material.

7. The semiconductor laser of claim 1, wherein the active layer is made of an AlGaAs semiconductor material.

8. The semiconductor laser of claim 1, wherein the active layer is made of an AlGaInP semiconductor material.

9. The semiconductor laser of claim 1, wherein a length ratio of the $1^{st}$ insulating film between the $2^{nd}$ insulating film in a length direction of the resonator is 2:3.

10. The semiconductor laser of claim 1, wherein a ratio of the $1^{st}$ refractive index to the $2^{nd}$ refractive index is 2.23/1.49 or more.

11. The semiconductor laser of claim 1, wherein the $1^{st}$ refractive index is 2.23, and the $2^{nd}$ refractive index is 1.49.

12. The semiconductor laser of claim 1, wherein the $1^{st}$ insulating film is made of $Ta_2O_3$, and the $2^{nd}$ insulating film is made of $SiO_2$.

13. The semiconductor laser of claim 1, wherein the insulating layer further includes a $3^{rd}$ insulating film between the $1^{st}$ insulating film and the $2^{nd}$ insulating film, and the refractive index is set to decrease in an order of the $1^{st}$ insulating film, the $3^{rd}$ insulating film, and the $2^{nd}$ insulating film.

* * * * *